US007021839B2

(12) United States Patent
Ho

(10) Patent No.: US 7,021,839 B2
(45) Date of Patent: Apr. 4, 2006

(54) LOW PROFILE OPTOCOUPLERS

(76) Inventor: Dominique Ho, Block 460 Hougang Avenue 10, #07-986, Singapore (SG) 530460

( * ) Notice: Subject to any disclaimer, the term of this patent is extended or adjusted under 35 U.S.C. 154(b) by 163 days.

(21) Appl. No.: 10/282,341

(22) Filed: Oct. 29, 2002

(65) Prior Publication Data

US 2004/0081409 A1  Apr. 29, 2004

(51) Int. Cl.
*G06B 6/00* (2006.01)

(52) U.S. Cl. ........................................ 385/92
(58) Field of Classification Search ............... 385/92, 385/93, 53
See application file for complete search history.

(56) References Cited

U.S. PATENT DOCUMENTS 4,614,958 A    9/1986  Mikami et al.
5,056,922 A *  10/1991 Cielo et al. ................. 356/604
5,150,438 A    9/1992  Brown
5,296,715 A *  3/1994  Kronberg .................... 250/551
5,702,775 A *  12/1997 Anderson et al. .......... 428/1.62
6,031,251 A    2/2000  Gempe et al.
6,525,386 B1 * 2/2003  Mills et al. ................. 257/433

OTHER PUBLICATIONS

Vishay Telefunken, "Optocouplers", website "www.vishay.com/products/optoelectronics/opc.html", pp. 1-3, Oct. 29, 2002.

* cited by examiner

*Primary Examiner*—Daniel Stcyr

(57) ABSTRACT

Disclosed is optoelectronic device comprising a light source, a generally coplanar disposed detector, the detector detecting light from the light source, a light conductive inner mold medium encapsulating the light source and the detector, and a medium of lesser density than the light conductive medium interfaced with a surface of the light conductive medium for which light reflection is desired.

20 Claims, 2 Drawing Sheets

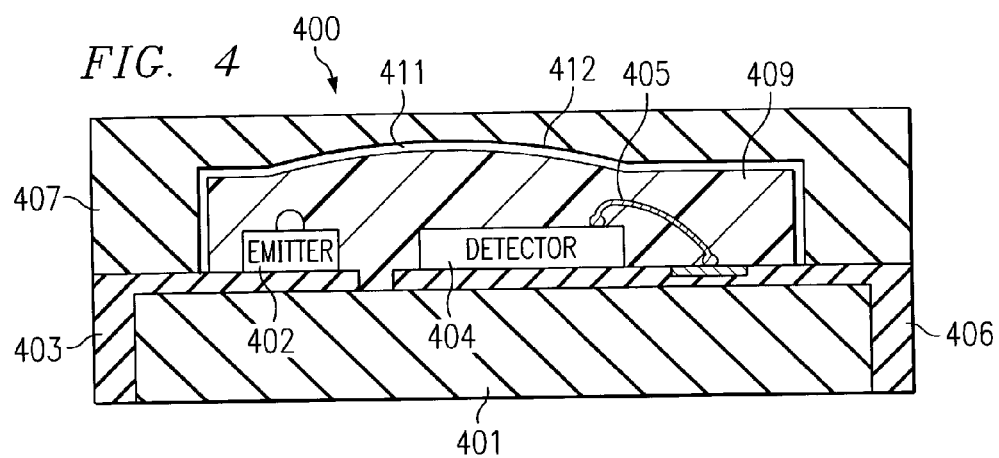
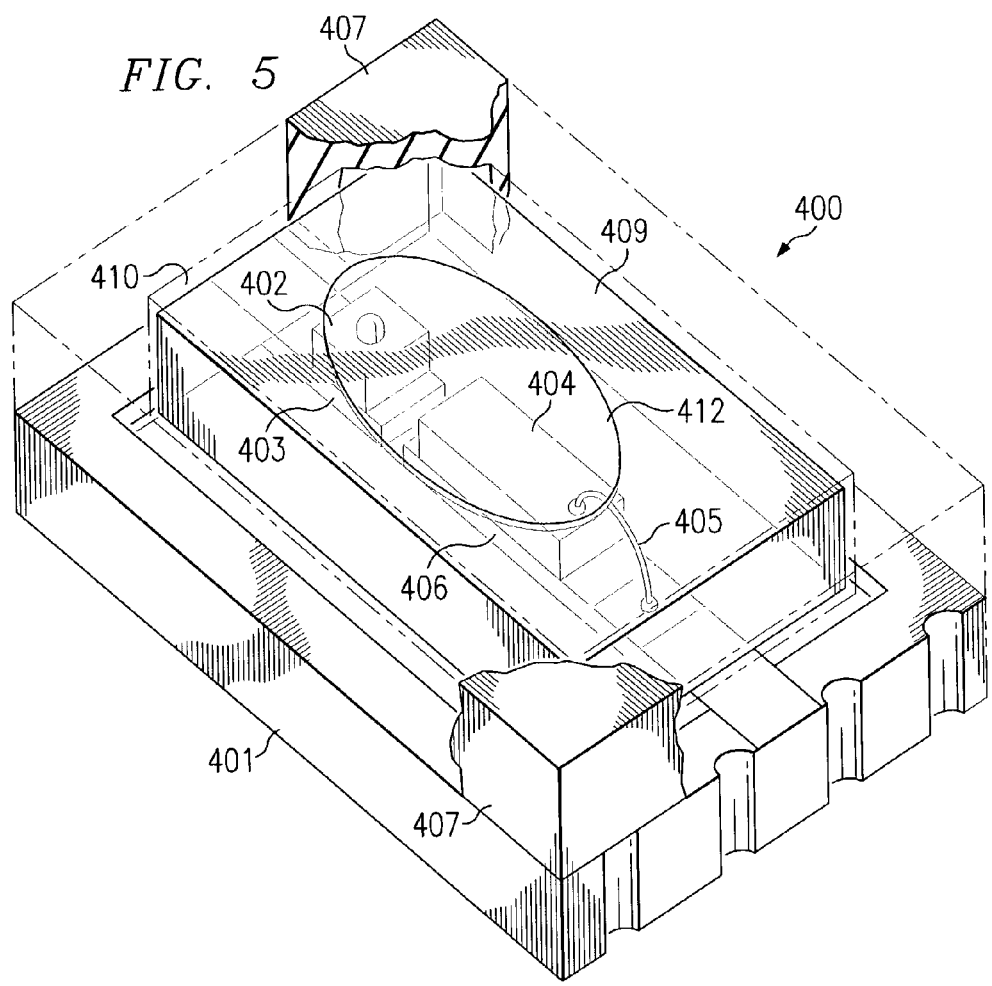

LOW PROFILE OPTOCOUPLERS

FIELD OF THE INVENTION

The present invention is generally related to optoelectronic devices and specifically to low profile, printed circuit board based optocouplers.

BACKGROUND OF THE INVENTION

Optocouplers are often used to provide galvanic isolation between different voltage sources in an electronic circuit. Functions of optocouplers include providing high voltage package isolation and isolating noise of a main signal from a resulting signal. In an electronic circuit, an optocoupler ensures electric isolation. For example, optocouplers are used in applications such as telecommunications equipment, programmable controllers, direct current (DC) to DC converters, switch-mode power supplies, alternating current (AC) to DC converters and battery chargers. Optocouplers are disclosed and discussed in Vishay Telefunken, "General Description Basic Function"; Vishay "Optoelectronics"; Mikami et al., U.S. Pat. No. 4,614,958; Brown, U.S. Pat. No. 5,150,438; and Gempe et al., U.S. Pat. No. 6,013,251, the disclosures of each of which are hereby incorporated herein by reference.

An optocoupter may be considered comparable to a transformer or relay in some cases. However, optocouplers are typically smaller, ensure considerably shorter switching times, eliminate contact bounce, eliminate interference caused by arcs, and do not experience mechanical wear. Thus, optocouplers are particularly well suited for circuits used in microelectronics and also in data processing and telecommunication systems. Optocouplers are also used to promote component safety, such as in switch-mode power supplies.

In practice, a control circuit or the like is typically located on one side of the optocoupler, for example the emitter side, while a load circuit is located on the other side, the detector side in this example. The circuits are electrically isolated from each other by the optocoupler. Signals from the control circuit are transmitted optically to the load circuit, and are therefore free of reciprocal effects.

In most cases, optical transmission by an optocoupler employs light beams with wavelengths spanning from the red to infrared range. The bandwidth of signals transmitted by an optocoupler typically range from a DC voltage signal to frequencies in the MHz band, although signal frequencies in the GHz range are possible.

FIG. 1 shows an optocoupler configuration representative of the majority of optocoupler packages found today. As shown in FIG. 1 optocoupler package 100 defines light emitting device or diode (LED) 102 directly above detector 104 separated by generally transparent insulating material 109. Also shown in FIG. 1 for completeness are lead 103 coupled to LED 102 and lead 106 coupled to detector 104 by bond wire 105. Leads 103 and 106 provide signal communication between components of optocoupler package 100 and those external thereto, such as devices disposed upon printed circuit board 101.

In the above conventional configurations, the package height is limited by at least the sum of the device heights (height of LED 102 plus the height of detector 104), with additional material such as transparent insulating material 109 and mold compound 107 required to complete the package adding to the package height. However, as today's electronic applications become more and more complex and integrated, there is a continuing need to reduce component package size without sacrificing functionality. This becomes more challenging with the emergence of notebook computers, personal digital assistants (PDA), cellular telephones, and the like.

FIG. 2 shows an optocoupler package configuration representative of those described in U.S. Pat. Nos. 5,150,438 and 6,031,251, referenced above. Specifically, shown in FIG. 2 is an in-line or coplanar arrangement for optocoupler package 200, providing a reduced optocoupler profile or height (although this configuration may have a larger substrate footprint than optocoupler package 100 associated therewith). Such coplanar optocoupler packages typically employ a transparent insulation material 209 surrounding LED 202 and detector 204. Further, a reflective material 211, coating transparent material 209, is provided. Mold compound 207 incarcerates the components of optocoupler package 200. Also shown in FIG. 2 for completeness are lead 203 coupled to LED 202 and lead 206 coupled to detector 204 by bond wire 205. Leads 203 and 206 provide signal communication between components of optocoupler package 200 and those external thereto, such as devices disposed upon printed circuit board 201.

In the above linear configurations, although the optocoupler package height has been reduced over the more typical configuration discussed above, the package configuration experiences disadvantages. For example, the indirect or reflective light coupling of previous configurations often suffers from inefficiencies in the reflection of the light. Accordingly, a need for an effective, efficient, low profile optocoupler still exists in the art today.

BRIEF SUMMARY OF THE INVENTION

An embodiment of the invention provides an optoelectronic device comprising a light source, a generally coplanarly disposed detector, the detector receiving light from the light source, a light conductive inner mold medium encapsulating the light source and the detector, and a medium of lesser density than the light conductive medium interfaced with a surface of the light conductive medium for which light reflection is desired.

An embodiment of the invention provides an optocoupler comprising a light source, a photo detector, the photo detector detecting light from the light source, an inner mold medium encapsulating the light source and the detector, and an air film interfaced with at least one surface of the inner mold medium.

An embodiment of the invention provides a method for optoelectric detection comprising encapsulating an emitter and a generally coplanar detector in a transparent inner mold, covering the inner mold with an opaque outer mold, spacing the inner mold and the outer mold apart, defining an air gap there between, emitting light from the light source, and reflecting the light from the emitter to the detector using total internal reflection phenomenon.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the present invention, reference is now made to the following descriptions taken in conjunction with the accompanying drawing, in which:

FIG. 4 is a partially fragmented view of another embodiment of a low profile optocoupler in accordance with the present invention employing an ellipsoidal lens; and FIG. 5 is a partially fragmented perspective view of the optocoupler of FIG. 4.

DETAILED DESCRIPTION OF PREFERRED EMBODIMENTS

Figure 1:
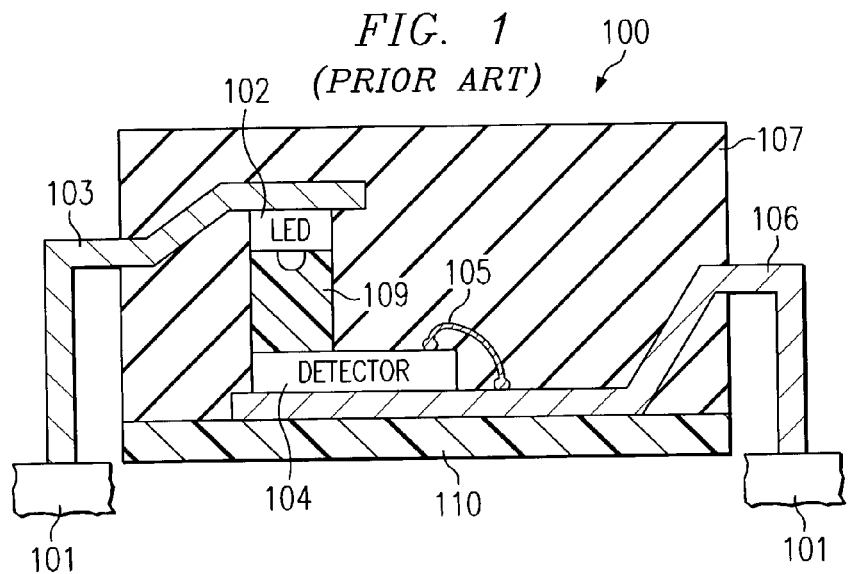
FIG. 1 is a partially fragmented view of a prior art optocoupler.
Figure 2:
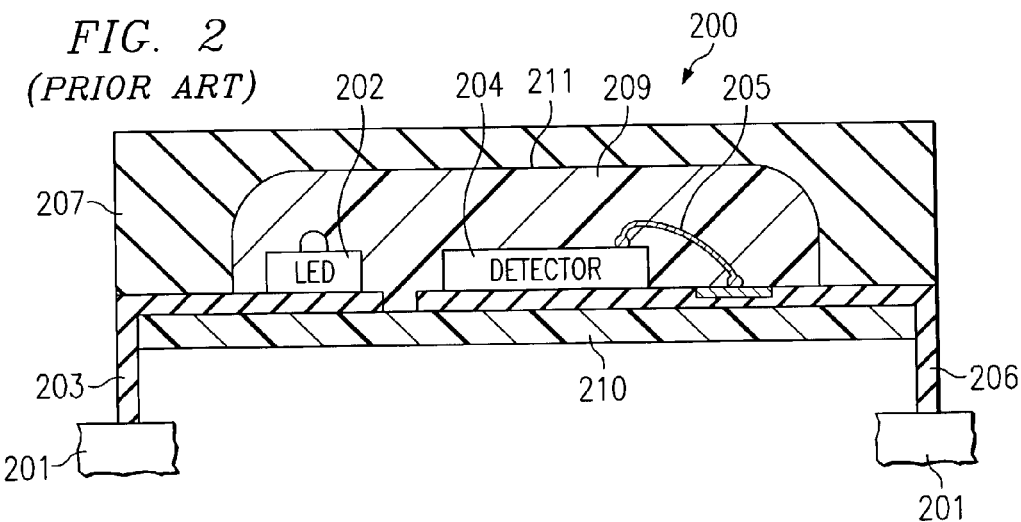
FIG. 2 is a partially fragmented view of a prior art linear optocoupler.

The present invention is directed to systems and methods for providing low profile optocouplers. Modem electronics and related components, such as PCMCIA cards and readers call for an optocoupler package that has a low profile that may be in the 1.4 mm to 1.7 mm range, or less. However, for most optocoupler applications, electrical isolation is desired between the emitter and detector device of the optocoupler. Accordingly, providing an optocoupler package configuration that is sufficiently low profile (e.g. having a profile less than 1.7 mm or more preferably less than 1.4 mm) is challenging. The challenges presented are further compounded by physical limitations present in attempting to implement an indirect or reflective coupling configuration. For example, efficiencies with respect to the indirect coupling of light between an emitter and detector of a linear optocoupler configuration are often an issue. Accordingly, in order to reduce the overall package height and effectively and efficiently provide light coupling in a linear optocoupler configuration a package configuration may be adapted in accordance with the present invention.

Light propagating through an optical medium can be contained within the medium by a phenomenon known as total internal reflection (TIR). When light travels from a denser medium into a less dense medium, it will be reflected back into the denser medium if the angle of incidence is less than a certain critical angle. The critical angle can be defined as the angle below which light inside the denser medium should strike the boundary in order to be reflected back into the medium rather than be transmitted through the boundary and out of the medium.

According to embodiments of the present invention the medium outside of an optical medium in which an emitter and detector of an optocoupler are disposed preferably has a lower index of reflection than the optical medium. Thus, according to the TIR phenomenon, light inside the optical medium that strikes the boundary at an angle smaller than the critical angle does not pass through the boundary and is reflected back into the optical medium. It should be appreciated that, in this embodiment, the angle of incidence is affected by the height of the optical medium. Therefore, the height of the optical medium, and correspondingly the profile of the package configuration, may be established at least in part as a function of the critical angle. Synergistically, as the packaging profile is shortened, the angle of incidence becomes more acute (less than the critical angle) as desired for implementation of the TIR phenomenon. Additionally or alternatively, the critical angle, and thus an achievable package profile, may be selected or adjusted through manipulation of the media density differences (e.g. utilizing a more dense optical media and/or utilizing a less dense medium outside the optical medium. Accordingly, optical medium height, optical medium density, and density of the medium outside of the optical medium may all be selected to provide desired optocoupler package attributes.

To make use of TIR in the present optocoupler package, light should travel from a denser medium to a less dense medium. Accordingly, to trap light within a transparent inner mold, that may have a reflective index of about 1.6, the medium surrounding the inner mold should be less dense, for example, having a reflective index of less than 1.6. Air has a reflective index of about 1.0. By creating a thin air film between the inner and outer mold of an optocoupler package, light may be trapped within the inner mold, eliminating need for a reflective surface coating the inner mold surface. It should be appreciated that proper selection of media densities, heights, etcetera may provide improved reflection (trapping) of light as compared to typical reflective coatings.

Figure 3:
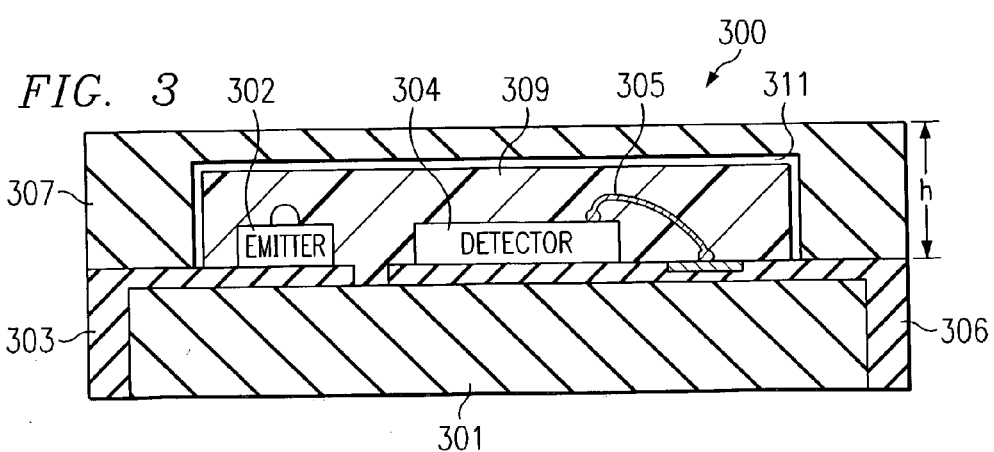
FIG. 3 is a partially fragmented view of an embodiment of a low profile optocoupler in accordance with the present invention employing a thin air film.

Turning to FIG. 3, optocoupler 300, in an embodiment of the present invention taking advantage of the TIR phenomenon, is shown. Emitter 302, such as may comprise any suitable light source including a LED, LASER, and the like, and detector 304, such as may comprise any suitable photoelectric receiver including a photo diode, photo transistor, and the like, are positioned coplanar on substrate 301, such as may comprise an integrated circuit substrate, a printed circuit board (PCB), or the like. This coplanar or linear configuration provides an initial degree of reduction of the package profile or height (h) of optocoupler 300 over that of FIG. 1. In the embodiment of FIG. 3, leads 303 and 306 extend from emitter 302 and detector 304 (using bond wire 305), respectively, to form edge connectors along an edge of substrate 301. Of course, other lead configurations may be utilized according to the present invention.

Although a coplanar configuration is shown herein, it shall be appreciated that coplanar configurations of the present invention are intended to encompass a generally coplanar configuration wherein the emitter and detector are somewhat out of the same plane in the profile, such as where one of emitter 302 and detector 304 are disposed directly upon substrate 301 and the other one of emitter 302 and detector 304 are disposed upon a corresponding one of leads 303 and 306. Such generally planar configurations may include configurations in which the relative positions of the emitter and detector are such that signals are properly reflected from the interface of transparent inner mold 309 and air film 311 according to the TIR phenomenon. Generally planar configurations wherein the emitter and detector are somewhat out of the same plane in the profile may be particularly useful where the emitter and detector are sized differently in the profile, wherein the emitter and detector have different focal lengths associated therewith, etcetera.

According to the illustrated embodiment, double encapsulation is used to trap the light emissions from emitter 302 within light conductive or transparent inner mold structure 309 using air film 311. Specifically, air film 311 is preferably defined between inner transparent mold 309 encapsulating emitter 302 and detector 304 and outer opaque mold 307 encapsulating inner transparent mold 309. With this configuration, the overall package height can be reduced, preferably to below 2 mm.

Generally, inner mold 309 may comprise an epoxy resin that has good optical properties, such as high transmittance, with a reflective index greater than 1.0, wherein air is used as an outer layer thereof, and having profile thickness in the range of 0.3 to 0.7 mm, depending upon the thickness of the encapsulated die. Although a preferred embodiment of the present invention utilizes an epoxy resin in providing inner mold 309, embodiments of the present invention may utilize any suitable material, such as plastics, glass, various resin compounds, and the like, providing light transmittance and having a reflective index greater than a material utilized as a surrounding medium, air film 311 herein.

The resin comprising outer mold 307 is preferably comprised of an opaque lightproof mold resin to thereby provide protection with respect to light noise as well as physical protection of the various components of optocoupler 300. For example, outer mold 307 may comprise an epoxy resin having an opacifier therein and/or impact modifier therein. Of course, other materials may be utilized in providing outer mold 307, such as plastics, metals, various resin compounds, and the like.

Air film 311 is preferably at least one to two mils thick. However, air film 311 is preferably as thin as possibly allowed by manufacturing practices, as long as it functions to facilitate TIR. Further, differential thermal expansion of the material of the inner mold and outer mold may dictate a minimum thickness for air film 311. It should be appreciated that, although optocoupler 300 has been discussed above with reference to air film 311, the present invention is not limited to the use of "air" as air film 311. Mediums of various densities and other attributes may be utilized in achieving the TIR phenomenon according to the present invention. For example, a medium of lesser density than air, such as helium or nitrogen, may be utilized in selecting a desired critical angle and/or to accommodate the use of an inner mold medium having a density providing a reflective index of 1.0 or less.

In order to optimize the coupling of light between an emitter and detector when the TIR phenomenon is employed within an optocoupler package of the present invention, a lens configuration may be used. For example, an ellipsoidal optical lens may be cast into the top surface of the inner mold, such as to provide a concave lens surface facing the emitter and/or detector of the optocoupler. This optical lens may be configured to maximize the reflected incidence of light and reduce the angle of incidence light, facilitating a lower package profile and/or achieving greater efficiencies with respect to the coupling of light between emitter and detector.

Turning to FIGS. 4 and 5 an embodiment of present inventive optocoupler 400 employing lens 412 is shown. Emitter 402 and detector 404 (such as may correspond to emitter 302 and detector 304 of FIG. 3) are positioned coplanar (or generally coplanar) on substrate 401. As with embodiment 300 of FIG. 3, using this configuration, the package height of optocoupler 400 is reduced relative to optocoupler packages such as that of FIG. 1. Double encapsulation is preferably used to trap the light emissions from emitter 402 within inner mold structure 409. As with the embodiment of FIG. 3, leads 403 and 406 extend from emitter 402 and detector 404 (using bond wire 405) to form edge connectors along edges of substrate 401. Of course, other lead configurations may be utilized according to the present invention.

The resin comprising inner mold 409 preferably has a high light-transmission property but with a reflective index greater than 1.0. The resin comprising outer mold 407 is preferably lightproof to prevent the entrance of external light that might add noise to signals of optocoupler 400. The shape of inner mold 409 may be defined, at least in part, by encapsulation of devices 402 and 404.

In the top of the inner mold, lens 412 is defined to improve light transmission from emitter 402 to detector 404. Lens 412 may be formed using mold casting techniques when encapsulating emitter 402 and detector 404 in inner mold 409. Additionally or alternatively, lens 412 may be formed using post-forming techniques, such as grinding, milling, polishing, etcetera, with respect to inner mold 409.

Lens 412 is preferably sized and positioned to be placed in juxtaposition with the top of emitter 402 and detector 404, as is apparent in FIG. 5. Use of different integrated circuits (ICs) and different emitter/detectors in different optocoupler products may result in different lens positions and/or configurations. In short, the lens position may be dependent upon the optical characteristics of the emitter and/or the detector.

Lens 412 preferably has an ellipsoidal shape that may be determined through computer simulation studies for different optocoupler applications and emitter/detector parings or through empirical study. However, other lens shapes and configurations may be utilized, such as circular, cylindrical, anamorphic, aspheric, Fresnel, hemispheric, parabolic, spiral, etcetera, as well as combinations of any of the foregoing. With lens 412, optocoupler 400 is able to improve light transmission between emitter 402 and detector 404 for numerous spectrums. With this configuration, the overall package height can be significantly reduced below 2 mm. Preferably, the depth of the lens is very shallow to avoid increasing the profile height of optocoupler 400.

According to embodiments of the present invention, emitter 402 and detector 404 are preferably positioned on ellipse centers of lens 412 so as to make use of the particular angles of lens 412 to transmit more light to detector 404 and, thereby, improve the light coupling efficiency of optocoupler 400. In such an embodiment, emitter 402 and photo diode 404 are preferably positioned at equal distance from an absolute center of lens 412.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An optoelectronic device comprising:
   a light source;
   a generally coplanarly disposed detector, said detector receiving light from said light source;
   a light conductive inner mold medium encapsulating said light source and said detector; and
   a medium of lesser density than said light conductive medium interfaced with a surface of said light conductive medium for which light reflection is desired.

2. The device of claim 1 further comprising:
   an opaque outer mold encapsulating said inner mold medium and spaced apart from said inner mold medium to thereby encapsulate said medium of lesser density.

3. The device of claim 1 further comprising a lens disposed in a light path between said light source and said detector.

4. The device of claim 3 wherein said lens is disposed on said surface of said light conductive medium.

5. The device of claim 3 wherein said lens is disposed above said light source and said detector.

6. The device of claim 5 wherein said lens is centered between said light source and said detector to focus said light from said light source on said detector.

7. The device of claim 6 wherein said lens presents a concave surface in a direction of said light source and said detector.

8. The device of claim 7 wherein said lens is ellipsoidal extending, at least in part, from over said light source to over, at least in part, said detector.

9. The device of claim 1 wherein said inner mold medium has an index of reflection greater than one.

10. The device of claim 1 wherein said medium of lesser density comprises:
    a thin air film.

11. An optocoupler comprising:
    a light source;
    a photo detector, said photo detector detecting light from said light source;
    an inner mold medium encapsulating said light source and said detector; and
    a film interfaced with at least one surface of said inner mold medium, wherein a medium of said film has lesser density than said inner mold medium.

12. The device of claim 11 wherein material comprising said inner mold has an index of reflection greater than one.

13. The device of claim 11 wherein said light source are disposed substantially coplanar and said at least one surface provides reflective communication of light from said light source to said photo detector.

14. The device of claim 11 further comprising a lens disposed above and centered between said light source and said detector focusing said reflected light from said light source onto said detector.

15. The device of claim 14 wherein said lens extends, at least in part, from over said light source to over, at least in part, said detector.

16. The device of claim 14 wherein said lens is suspended in said inner mold below said film.

17. The device of claim 11 further comprising:
    an opaque outer mold encapsulating said inner mold spaced apart from said inner mold.

18. A method for optoelectric detection comprising:
    encapsulating an emitter and a generally coplanar detector in a transparent inner mold;
    covering said inner mold with an opaque outer mold;
    spacing said inner mold and said outer mold apart, defining an air gap there between;
    emitting light from said light source; and
    reflecting said light from said emitter to said detector using total internal reflection phenomenon.

19. The method of claim 18 wherein said encapsulating further comprises providing an inner mold material with an index of reflection greater than one.

20. The method of claim 18 further comprising disposing a lens above said light source and said detector, said lens focusing said light from said light source on said detector.

* * * * *